United States Patent
Flanigan et al.

(10) Patent No.: US 7,507,521 B2
(45) Date of Patent: Mar. 24, 2009

(54) SILICON BASED OPTICALLY DEGRADED ARC FOR LITHOGRAPHIC PATTERNING

(75) Inventors: Kyle Y. Flanigan, Portland, OR (US); Juan E. Dominguez, Hillsboro, OR (US); Sergei V. Koveshnikov, Hillsboro, OR (US); Ernisse Putna, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 499 days.

(21) Appl. No.: 10/914,605

(22) Filed: Aug. 9, 2004

(65) Prior Publication Data

US 2006/0029879 A1 Feb. 9, 2006

(51) Int. Cl.
G03F 7/00 (2006.01)
G03F 7/004 (2006.01)

(52) U.S. Cl. ..................... 430/270.1; 528/10
(58) Field of Classification Search ............. 430/270.1; 528/10
See application file for complete search history.

(56) References Cited

U.S. PATENT DOCUMENTS

| | | | |
|---|---|---|---|
| 4,491,628 A | 1/1985 | Ito et al. | |
| 4,693,781 A | 9/1987 | Leung et al. | |
| 5,395,790 A | 3/1995 | Lur | |
| 5,492,858 A | 2/1996 | Bose et al. | |
| 5,541,436 A | 7/1996 | Kwong et al. | |
| 5,956,598 A | 9/1999 | Huang et al. | |
| 6,054,393 A | 4/2000 | Niccoli | |
| 6,057,208 A | 5/2000 | Lin et al. | |
| 6,103,456 A | 8/2000 | Többen et al. | |
| 6,129,091 A | 10/2000 | Lee et al. | |
| 6,159,823 A | 12/2000 | Song et al. | |
| 6,165,854 A | 12/2000 | Wu | |
| 6,265,283 B1 | 7/2001 | Nariman et al. | |
| 6,329,118 B1 * | 12/2001 | Hussein et al. | 430/270.1 |
| 6,365,529 B1 * | 4/2002 | Hussein et al. | 438/780 |
| 6,417,070 B1 | 7/2002 | Ballantine et al. | |
| 6,444,588 B1 | 9/2002 | Holscher et al. | |
| 6,541,382 B1 | 4/2003 | Cheng et al. | |
| 6,824,879 B2 * | 11/2004 | Baldwin et al. | 428/447 |
| 6,876,017 B2 * | 4/2005 | Goodner | 257/254 |
| 6,930,028 B1 | 8/2005 | Hanratty et al. | |
| 7,101,798 B2 * | 9/2006 | Goodner et al. | 438/689 |
| 7,119,031 B2 | 10/2006 | Blalock et al. | |
| 7,125,783 B2 | 10/2006 | Lo et al. | |
| 7,157,755 B2 * | 1/2007 | Goodner | 257/254 |
| 2001/0026979 A1 | 10/2001 | Chern | |

(Continued)

OTHER PUBLICATIONS

Loy et al "Bridged Polysilsesquioxanes. Highly Porous Hybrid Organic-Inorganic Material", Chemical Reviews, vol. 95, No. 5, pp. 1431-1442 (1995).*

(Continued)

Primary Examiner—Amanda C Walke
(74) Attorney, Agent, or Firm—Fish & Richardson P.C.

(57) ABSTRACT

An optically tuned SLAM (Sacrificial Light-Absorbing Material) may be used in a via-first dual damascene patterning process to facilitate removal of the SLAM. The monomers used to produce the optically tuned SLAM may be modified to place an optically sensitive structure in the backbone of the SLAM polymer. The wafer may be exposed to a wavelength to which the SLAM is tuned prior to etching and/or ashing steps to degrade the optically tuned SLAM and facilitate removal.

15 Claims, 6 Drawing Sheets

U.S. PATENT DOCUMENTS

2002/0094593 A1 7/2002 Chiou et al.
2005/0029229 A1* 2/2005 Chae et al. .................. 216/67
2006/0073424 A1 4/2006 Koveshnikov et al.

OTHER PUBLICATIONS

Aroutiounia, V.M., et al., "Calculations of the reflectance of porous silcon and other antireflection coating to silicon solar cells," *Thin Solid Films*, 403-404:517-521, Feb. 2002.

Beloto, A.F., et al., Sponge-Like and Columnar Porous Silicon Implanted with Nitrogen by Plasma Immersion Ion Implantation (PIII), *Surface & Coatings Technology*, PBII 2001 International workshop on Plasma-Based Ion Implantation No. 6, Grenoble, France, 156(1-3):267-271, (2002).

Birkholz, M., et al., "Solar-Cell Suitable µc-Si Films Grown by ECR-CVD," *Mat. Res. Soc. Symp. Proc.*, 609:A5.5.1-A5.5.6, Apr. 2000.

Lee, J.-S., et al., "Nanostructural and photoluminescence features of nanoporous silicon prepared by anodic etching," *Applied Surface Science*, 190(1-4):171-175, May 2002.

Wang, C.L., et al., "Nanometer-scale pores in low-*k* dielectric films probed by positron annihilation lifetime spectroscopy," *Applied Physics Letters*, 81(23):4413-4415, Dec. 2002.

Whelan, C.M., et al., "Sealing of Porous Low-*k* Dielectrics," *Electrochemical and Solid-State Letters*, 7(2):F8-F10, (2004).

Yamani, Z., et al., "Revival of interband crystalline reflectance from nanocrystallites in porous silicon by immersion plating," *Applied Physics Letters*, 74(23):3483-3485, Jun. 1999.

Yang, H., et al., "Study of $SiH_4$-based PECVD Low-k Carbon-doped Silicon Oxide," *Mat. Res. Soc. Symps. Proc.*, 612:D3.3.1-D3.3.7, (2000).

\* cited by examiner

SILICON BASED OPTICALLY DEGRADED ARC FOR LITHOGRAPHIC PATTERNING

BACKGROUND

Dual damascene (DD) patterning is a technique for forming interconnect structures in integrated circuits (ICs) using conductive copper metal lines. The copper metal lines may be inlaid into an oxide or low-k dielectric layer by plating the metal into preformed trenches. Chemical mechanical polishing may then be performed to remove excess metal from the wafer surface.

Via-first DD patterning is a DD process in which via fill material may be used to minimize the resist thickness variations in the trench patterning step. The via-first approach to DD patterning may require high etch selectivity between the interlevel dielectric (ILD) and etch stop layer (ESL), substrate reflectivity control, and thorough removal of post-etch residues. A siloxane-based material referred to as SLAM (Sacrificial Light-Absorbing Material) satisfies many of these requirements. SLAM features a comparable dry etch rate to many ILDs, good etch selectivity to photoresists (or "resists"), high absorption of light at exposure wavelengths, and compatibility with standard lithographic processes.

Current SLAM materials may be formulated to be compatible with silicon oxide-based ILD materials in both etch rate and cleanability. These silicon-oxide materials are typically more difficult to remove than resists, and may require more aggressive chemical or thermal processing. Consequently, harsh processing conditions (thermal and/or chemical) may be required in SLAM-assisted DD patterning to remove the SLAM and resists.

DETAILED DESCRIPTION

Dual damascene (DD) patterning is a technique for forming interconnect structures in integrated circuits (ICs) using conductive copper metal lines. The copper metal lines may be inlaid into an oxide or low-k dielectric layer by plating the metal into preformed trenches. Chemical mechanical polishing may then be performed to remove excess metal from the wafer surface.

Figure 1A:
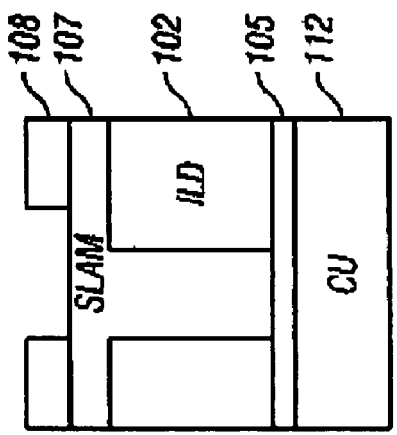
FIGS. 1A-1E illustrate a via-first DD patterning process.
Figure 1B:
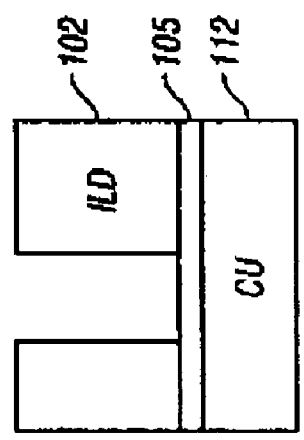
Figure 1C:
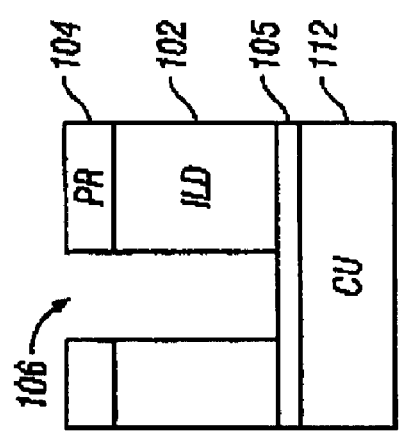
Figure 1D:
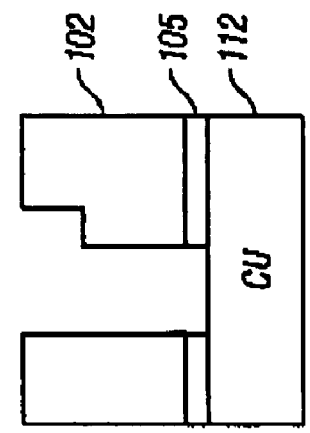
Figure 1E:
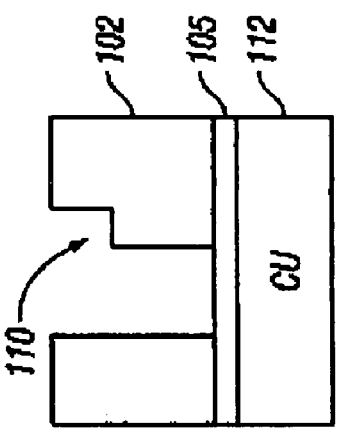

FIGS. 1A-1E illustrate an exemplary via-first DD patterning process using an inorganic interlevel dielectric (ILD) 102, e.g., a silicon oxide-based ILD such as fluorinated silicon oxide (SiOF) or carbon-doped oxide (CDO). A photoresist (or "resist") layer 104 may be patterned to expose regions on the surface of the ILD layer in a first photolithography step. The exposed regions in the surface of the ILD layer may be etched down to an etch stop layer (ESL) 105 covering the copper layer to form vias 106 (FIG. 1A). The resist may then be removed (FIG. 1B). A siloxane-based polymer referred to as SLAM (Sacrificial Light-Absorbing Material) 107 may be used to enable DD patterning of the silicon oxide-based ILD. Another resist layer 108 may be patterned to expose regions of the surface of the SLAM layer in a second photoresist step (FIG. 1C). The exposed SLAM may be plasma etched through to the ILD to form trenches 110, and the resist and SLAM may then be stripped away (FIG. 1D). The exposed ESL 105 in the via may then be etched to expose the copper metal 112 (FIG. 1E).

In the stripping process used to remove the resist 108 and SLAM 107 (FIGS. 1C and 1D), the resist may first be ashed using a standard low temperature recipe, and then a second higher temperature recipe may employed to partially decompose the SLAM layer. Both the ashed resist and partially decomposed SLAM may be cleaned using a sulfuric acid bath. These ashing processes may impact the total thermal budget of the wafers and have the potential to over-ash the wafers. Furthermore, throughput time may be increased due to the additional time needed to ash and clean the silicate.

Figure 2C:
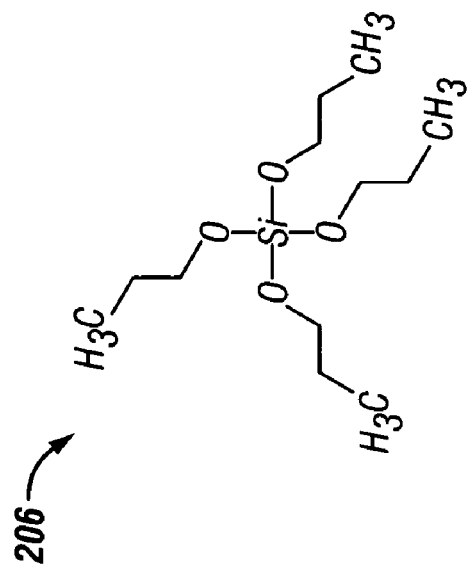
FIGS. 2A-C show the chemical structure of monomers used to a make SLAM (Sacrificial Light-Absorbing Material) polymer.
Figure 2B:
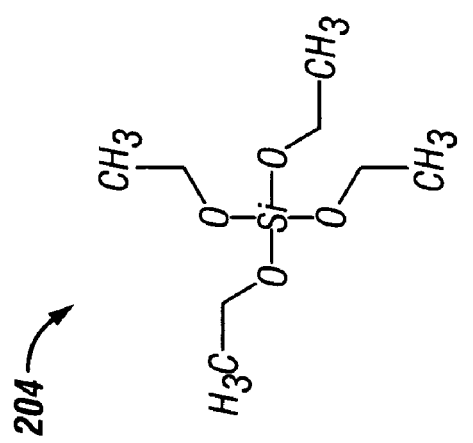
Figure 2A:
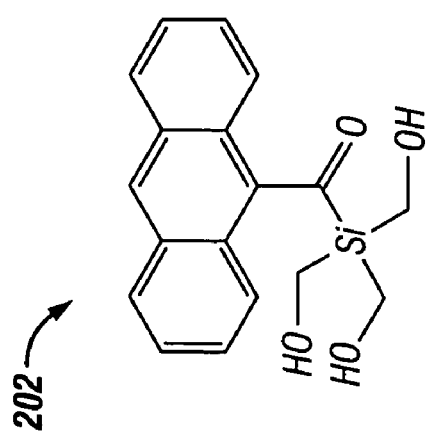

SLAM materials may be made from TESAC [9-anthracene-based dye] 202, tetraethoxysilane (TEOS) 204, and methyltriethoxysilane (MTEOS) 206, the chemical structures of which are shown in FIGS. 2A-C, respectively. These monomers may be polymerized to produce an organo-silicon macromolecule. The condensation reaction results in the creation of Si—O branched network between. 2500 and 3500 Daltons depending upon the catalyst used. The polymer may be cast onto a substrate with films ranging from 1500 Å to 4800 Å thick using a variety of bake conditions to drive off the solvent and increase the density of the film.

Figures 3A, 3B:
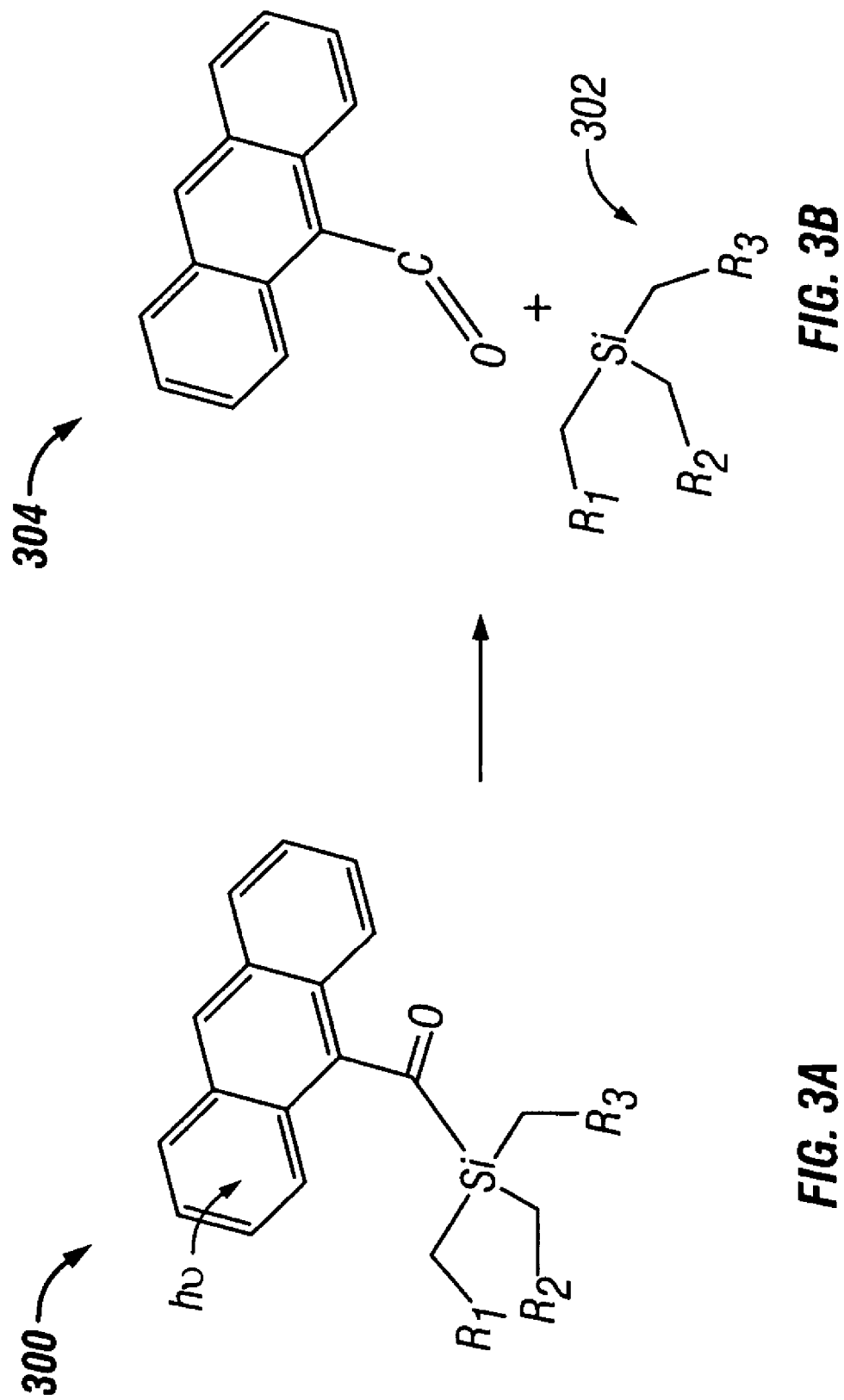
FIGS. 3A and 3B show the chemical structure of an exemplary SLAM polymer.

FIG. 3A shows the chemical structure of an exemplary SLAM polymer 300, where R1, R2, and R3 represent linkages to the network backbone via TEOS, MTEOS, or other TESAC moiety. It is believed that TESAC in SLAM may absorb a photon (hv). The photon may destabilize the conjugated anthracene system, which may result in cleavage of the 9-anthacene carboxylate 302 from the SLAM backbone 304, as shown in FIG. 3B. This may leave the backbone in a highly reactive state, making it susceptible to degradation by the low temperature ash process and to less aggressive clean chemistries.

Figure 4:
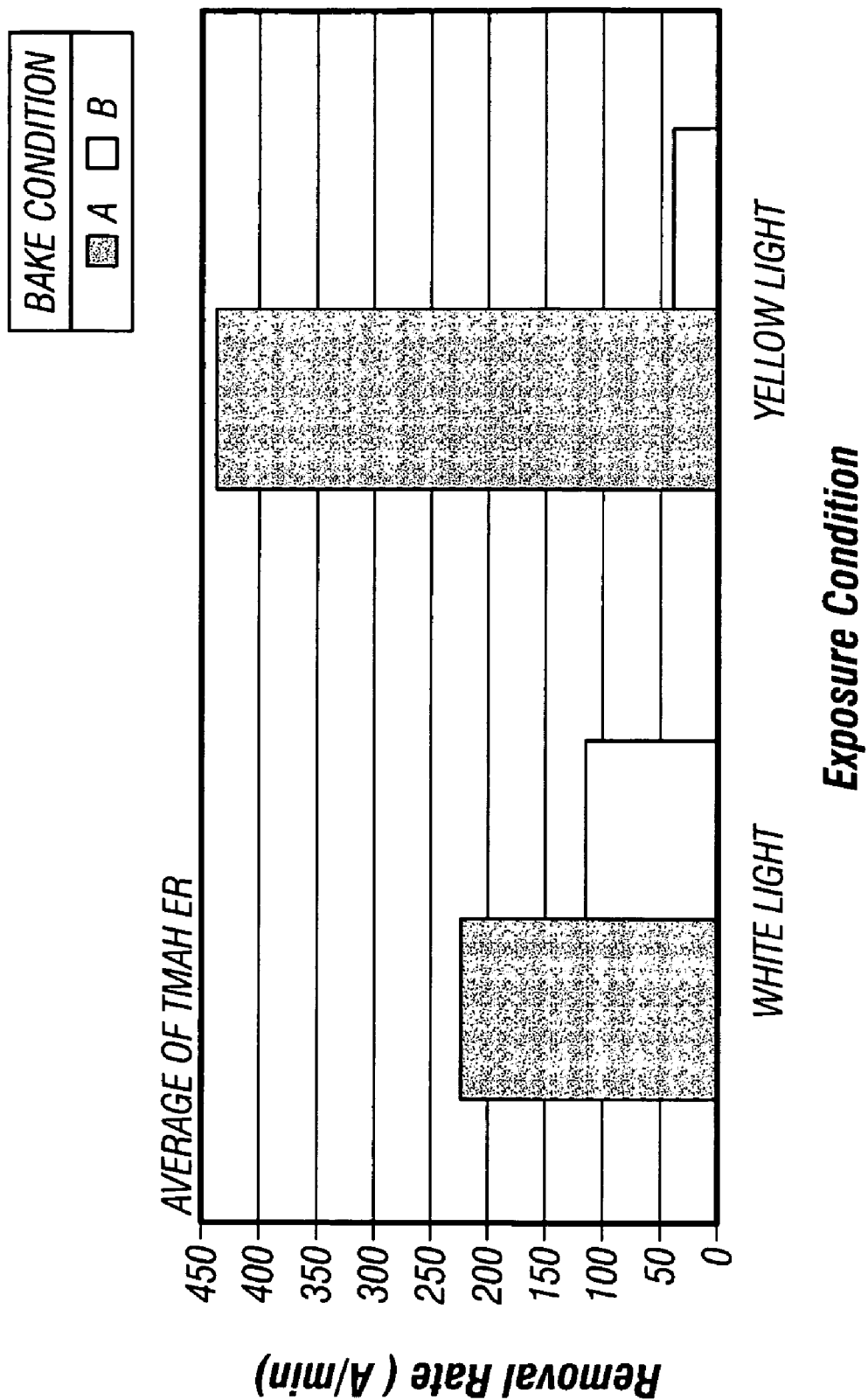
FIG. 4 is a plot showing the effect of exposure to light on the etch rate of SLAM.

FIG. 4 is a plot showing the effect of exposure to light on the etch rate of SLAM. Test wafers were coated with SLAM and baked at different temperatures (bake conditions A and B). The coated wafers were exposed for 4-6 hours in ambient white light (390 nm-780 nm) or to yellow light (577 nm-597 nm). As FIG. 4 shows, bake condition A (a less dense film) is more susceptible to erosion in a basic medium than the same material cured using the higher temperature bake (bake condition B). The etch rate delta between SLAM cured using bake conditions A and B increases from 110 Å/min after exposure to white light to 400 Å/min after exposure to yellow light. This limited data suggests that SLAM is sensitive to light and exposure degrades the cast SLAM films.

In an embodiment, the optical sensitivity of a SLAM material may be increased by modifying the monomers used to make the SLAM polymer. The monomers may be modified to incorporate a structure having the optical sensitivity functionality (the "optical moiety") into the SLAM backbone rather than having this structure located on a non-structural side chain as in typical SLAM materials (as shown in FIGS. 3A and 3B). Exposure to the proper wavelength or band of light (e.g., 640 nm or smaller) may cause the SLAM material to degrade and become more susceptible to the etch chemistry. Intensity and duration of the exposure may be selected to cause the SLAM material to degrade to a desired degree. To facilitate throughput, an intensity may be selected that requires a relatively short duration, e.g., on the order of minutes.

Figure 5B:
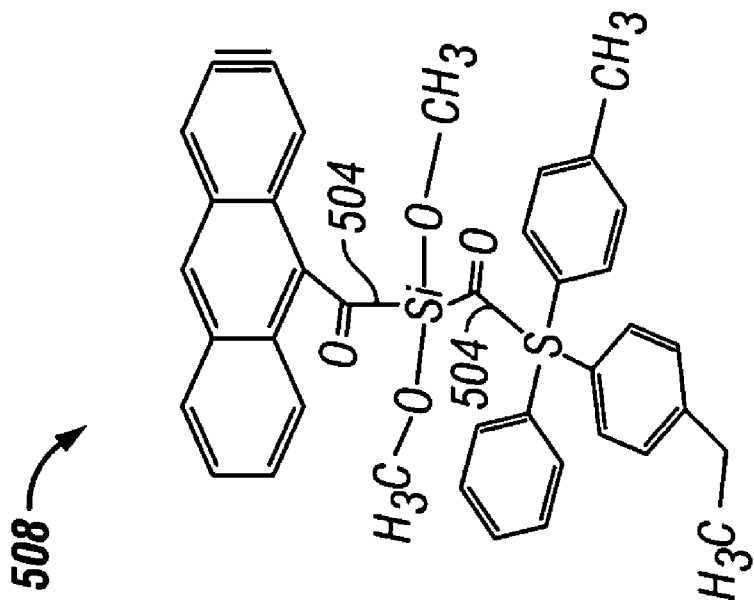
FIGS. 5A and 5B show the chemical structure of modified monomers which may be used to make an optically tuned SLAM.
Figure 5A:
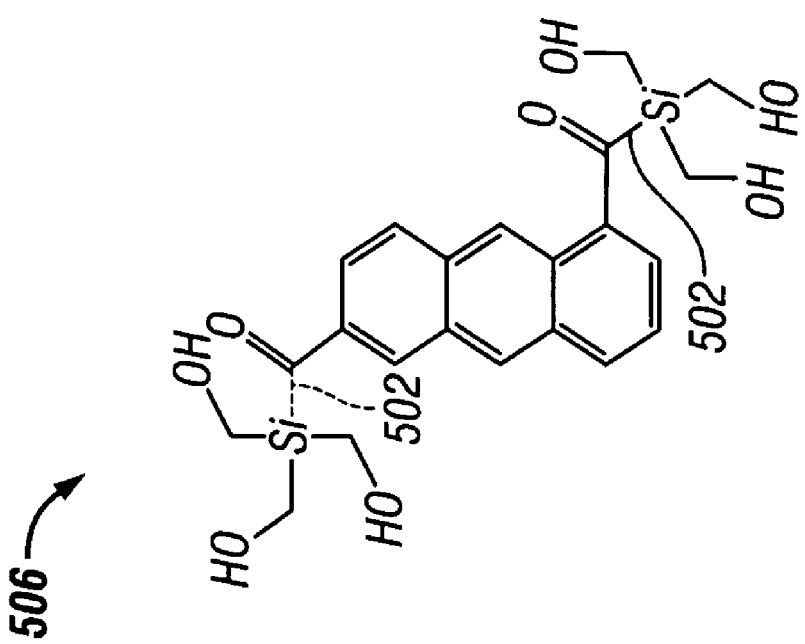

The optical moiety may be incorporated into the SLAM structure using standard silane condensation chemistries to produce an optically sensitive SLAM tuned to a particular wavelength or wavelengths. FIGS. 5A and 5B show the chemical structure of modified monomers which may be used to produce optically tuned SLAM materials. Optical exposure is expected to cleave the molecule at bonds 502 in FIG. 5A and 504 in FIG. 5B. The monomer 506 shown in FIG. 5A may be responsive to a single wavelength, whereas the monomer 508 shown in FIG. 5B may have its strongest absorption at two different wavelengths. For monomer 508, a first exposure at one of the wavelengths may be performed to enhance the etch rate of the SLAM for the etch operation and a second exposure at the other wavelength may be performed to assist with ash and removal operations.

Figure 6:
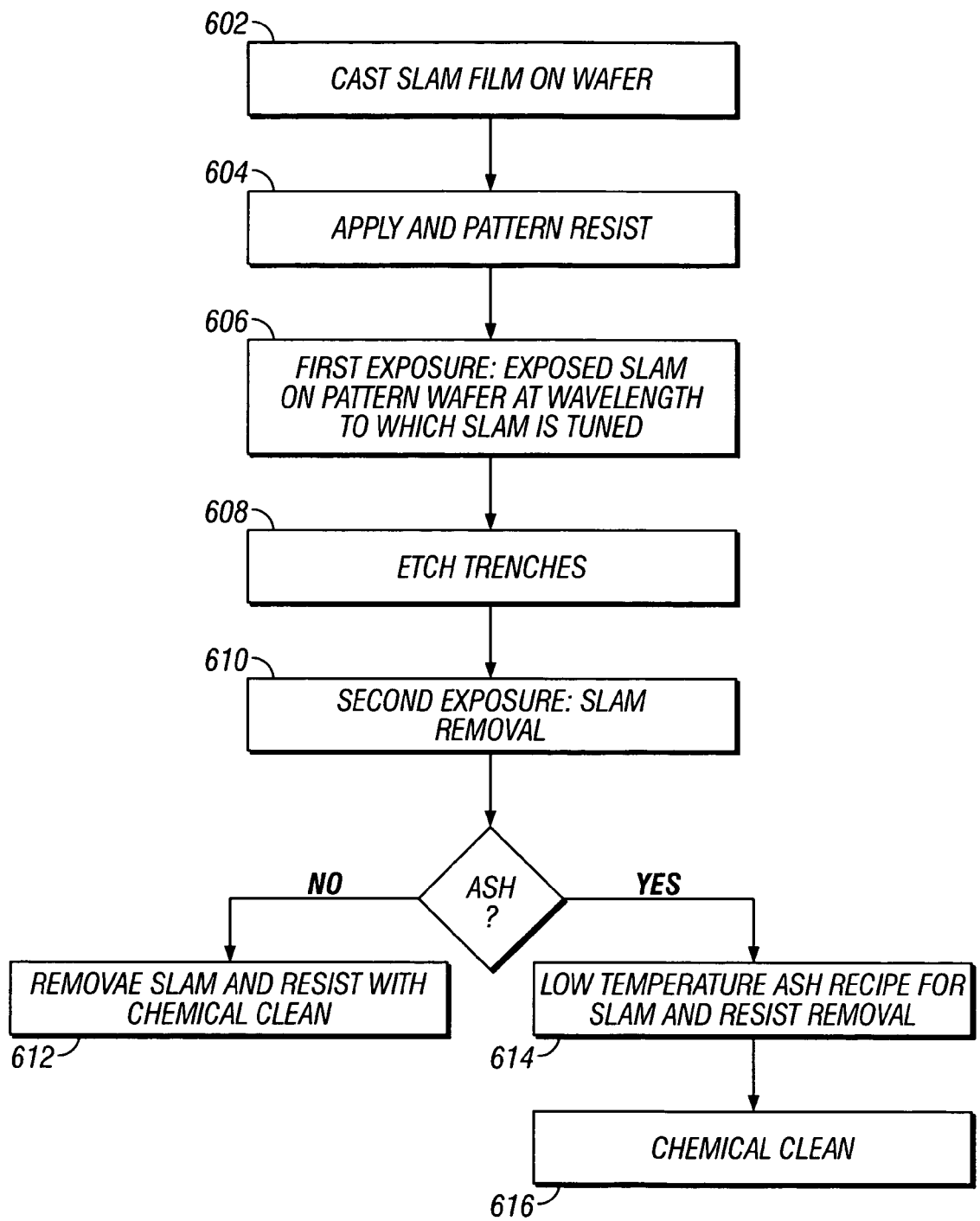
FIG. 6 is a flowchart describing a via-first DD patterning process utilizing an optically tuned SLAM according to an embodiment

FIG. 6 is a flowchart describing a via-first DD patterning process utilizing an optically tuned SLAM according to an embodiment. The SLAM may be applied to the wafer in a SLAM module (block 602). The SLAM may be coated with a resist, which may be exposed and developed in a lithography module to created a desired pattern on the SLAM layer (block 604).

In an embodiment, in situ adjustment of the etch rate of the SLAM may be enabled by exposing the SLAM using a blanket exposure tool prior to the high temperature etch of the SLAM layer in an etch module (block 606). The entire wafer may be exposed with wavelength(s) to which the SLAM is tuned. The length and intensity of the exposure may be tailored to modulate the etch rate of the SLAM to match the etch rate of different substrates (e.g., SiO, CDO, SiN, SiC, Si, etc.). Trenches may then be etched through the SLAM layer into the ILD layer (block 608).

If rework is required after the SLAM film is cast on the wafer (block 602) or after the lithography step (block 604) the wafer may be exposed using the blanket exposure tool to facilitate removal of the SLAM.

In an embodiment, a second exposure of the optically tuned SLAM may assist in the cleaning process (block 610). Optical degradation performed before this operation will increase the sensitivity of the SLAM film to the recipe used to remove the photo-resist and SLAM. In an embodiment, this may eliminate the need for ashing and enable removal of the SLAM using cleaning chemistries (block 612). In an alternative embodiment, the improved ash rate of SLAM after exposure may enable the use of the same low temperature ash recipes used for resist removal (block 614). Ashing may be performed in an ash module using plasma etching to oxidize the resist and the organic content of the SLAM. The wafer may then be cleaned using a standard resist clean chemistry (block 616).

Eliminating the ashing step or using low temperature ash recipes to remove the SLAM may decrease the thermal impact to the wafer. This may be advantageous in processes which are sensitive to thermal loading. This may increase the total number of rework operations to which a wafer may be subjected. Another potential advantage of using optical degradation to tune the SLAM to ash in conditions similar to the resist is that the ASH recipe may modified to use a endpoint cut off rather than a timed cutoff. This reduces the potential for over ashing and etching into the ILD.

A number of embodiments have been described. Nevertheless, it will be understood that various modifications may be made without departing from the spirit and scope of the invention. For example, blocks in the flowcharts may be skipped or performed out of order and still produce desirable results. Accordingly, other embodiments are within the scope of the following claims.

The invention claimed is:

1. A sacrificial light-absorbing material (SLAM) comprising:
 a Si—O branched network polymer having a backbone including a first chromophore sensitive to a first one or more wavelengths of light and a second chromophore sensitive to a different one or more wavelengths of light.

2. The SLAM of claim 1, wherein the backbone of the polymer is operative to cleave upon exposure to said one or more wavelengths of light.

3. The SLAM of claim 1, wherein the backbone includes another chromophore sensitive to another one or more wavelengths of light.

4. The SLAM of claim 1, wherein the chromophore comprises a conjugated system.

5. The SLAM of claim 4, wherein the conjugated system comprises a conjugated anthracene system.

6. The SLAM of claim 5, wherein the backbone comprises a pair of cleavable bonds to the chromophore.

7. The SLAM of claim 5, wherein the backbone comprises a pair of cleavable linkages between a carboxylate and the Si—O branched network.

8. A device comprising:
 a semiconductor substrate; and
 a sacrificial light-absorbing material (SLAM) layer above the semiconductor substrate, the SLAM layer comprising:
  a branched Si—O network,
  a chromophore sensitive to one or more wavelengths of light, and
  a pair of cleavable linkages between the chromophore and the branched Si—O network.

9. The device of claim 8, wherein the chromophore comprises a conjugated system.

10. The device of claim 9, wherein the conjugated system comprises a conjugated anthracene system.

11. The device of claim 8, wherein the pair of cleavable linkages comprises a pair of cleavable linkages between a carboxylate and the Si—O branched network.

12. A sacrificial light-absorbing material (SLAM) comprising:
 a Si—O branched network polymer having a backbone including a chromophore sensitive to one or more wavelengths of light, wherein
 the chromophore comprises a conjugated anthracene system, and
 the backbone comprises a pair of cleavable bonds to the chromophore.

13. A sacrificial light-absorbing material (SLAM) comprising:
 a Si—O branched network polymer having a backbone including a chromophore sensitive to one or more wavelengths of light, wherein
 the chromophore comprises a conjugated anthracene system, and
 the backbone comprises a pair of cleavable linkages between a carboxylate and the Si—O branched network.

14. A sacrificial light-absorbing material (SLAM) comprising:
 a Si—O branched network polymer having a backbone including a chromophore sensitive to one or more wavelengths of light, wherein
 the chromophore comprises a conjugated system, and
 the backbone comprises a pair of cleavable linkages between the chromophore and the Si—O branched network.

15. The SLAM of claim 14, wherein the cleavable linkages comprise linkages between a carboxylate and the Si—O branched network.

\* \* \* \* \*